United States Patent
Shinkawata

[11] Patent Number: 5,566,104
[45] Date of Patent: Oct. 15, 1996

[54] MEMORY CELL LAYOUT STRUCTURE FOR A SEMICONDUCTOR MEMORY DEVICE

[75] Inventor: Hiroki Shinkawata, Hyogo, Japan

[73] Assignee: Mitsubishi Denki Kabushiki Kaisha, Tokyo, Japan

[21] Appl. No.: 460,945

[22] Filed: Jun. 5, 1995

[30] Foreign Application Priority Data

Aug. 30, 1994 [JP] Japan ................................. 6-205114

[51] Int. Cl.$^6$ ................................. G11C 5/02; G11C 5/06
[52] U.S. Cl. ................................. 365/51; 365/63; 365/149
[58] Field of Search ................................. 365/51, 52, 63, 365/149

[56] References Cited

U.S. PATENT DOCUMENTS

| | | | |
|---|---|---|---|
| 5,365,474 | 11/1994 | Motonami | 365/51 |
| 5,383,151 | 1/1995 | Omishi et al. | 365/51 X |
| 5,396,451 | 3/1995 | Ema | 365/51 |
| 5,416,734 | 5/1995 | Hidaka et al. | 365/51 X |

FOREIGN PATENT DOCUMENTS

| | | |
|---|---|---|
| 61-274357 | 12/1986 | Japan . |
| 3-72675 | 3/1991 | Japan . |
| 4-23357 | 1/1992 | Japan . |
| 4-65872 | 3/1992 | Japan . |
| 5-41500 | 2/1993 | Japan . |
| 5-235298 | 9/1993 | Japan . |
| 5-243527 | 9/1993 | Japan . |
| 252219 | 7/1995 | Taiwan . |

OTHER PUBLICATIONS

"A Study of Close Packed Folded Bit-Line Cell Array (CPF) and Three Phase Folded Bit-Line Array/Circuit (TPF) for DRAM's", T. Saeki et al, pp. 5–256, Mar. 15, 1991.

*Primary Examiner*—Do Hyun Yoo
*Attorney, Agent, or Firm*—Lowe, Price, LeBlanc & Becker

[57] ABSTRACT

A plurality of memory cells are arranged spaced by an equal distance along one direction on a main surface of a semiconductor substrate, thus forming a first memory cell group, and a second memory cell group is arranged adjacent to the first memory cell group. In the second memory cell group, a plurality of memory cells are arranged spaced by the same distance as the first memory cell group, with central position of each memory cell of the second memory cell group being shifted by ⅙ with respect to the central position of each memory cell of the first memory cell group. Bit line pair and word lines are provided in a single layer, detouring storage node contacts.

9 Claims, 11 Drawing Sheets

1/7 PITCH

1/8 PITCH

| | | SENSE AMP | WORD LINE | | | | |
|---|---|---|---|---|---|---|---|
| | | | n-2 | n-1 | n | n+1 | n+2 |
| BIT LINE | m-2 | | D | D | R | D | D |
| | m-1 | | D | D | D | D | R |
| | m | 1 | D | R | D | D | D |
| | m+1 | | D | D | D | R | D |
| | m+2 | | R | D | D | D | D |

MEMORY CELL LAYOUT STRUCTURE FOR A SEMICONDUCTOR MEMORY DEVICE

BACKGROUND OF THE INVENTION

1. Field of the Invention

The present invention relates to a memory cell layout structure for a semiconductor memory device. More specifically, the present invention relates to a layout structure of memory cells in which element isolating regions between adjacent memory cells can be minimized, enabling highly dense layout, in a dynamic random access memory (DRAM).

2. Description of the Background Art

In a DRAM, generally, one memory cell consists of one capacitor and one switching transistor, the amount of charges stored in the capacitor are associated with "0" and "1", and thus information is recorded. When the information is to be read, potential difference between a bit line to which the memory cell to be read is connected and another bit line to which a dummy cell is connected is differentially amplified by a sense amplifier. However, since slight change in potential appearing on the bit line connected to the capacitor must be detected, the influence of external noise to the bit lines must be minimized.

As a method of eliminating external noise to the bit lines, the following method is believed to be most effective and common, Namely, a so called folded bit line structure including a plurality of bit lines arranged parallel to and adjacent to each other and sense amplifiers provided at one end of the bit lines is used, so as to set most of the noises in in-phase mode, whereby the noises are offset with each other.

FIG. 1 is a schematic diagram showing memory cells and peripheral circuitry connected to such folded bit lines. Referring to FIG. 1, bit line pair 1a and 1b are arranged orthogonal to word lines 21 to 24, a memory cell MC1 is connected at a crossing between bit line 1a and word line 21, a memory cell MC2 is connected at a crossing between bit line 1b and word line 22, a memory cell MC3 is connected at a crossing between bit line 1a and word line 23, and a memory cell MC4 is connected at a crossing between bit line 1b and word line 24. Each of the memory cells MC1 to MC4 consists of one MOS transistor and one capacitor. Bit line pair 1a, 1b is connected to a bit line equalizing and precharging circuit 3, a sense amplifier 4 and transfer gates 51 and 52. Bit line equalizing and precharging circuit 3 precharges potentials of bit line pair 1a and 1b, sense amplifier 4 amplifies potential difference from any of the memory cells MC1 to MC4 read to the bit line pair 1a, 1b, and the information is output to an I/O line pair 6 through transfer gates 51 and 52.

FIG. 2 shows a layout of the memory cells in the conventional DRAM shown in FIG. 1. Referring to FIG. 2, word lines 21, 22, . . . are provided orthogonal to folded bit line pair 1a, 1b, memory cells MC1 and MC3 are arranged along bit line 1a, and memory cells MC2 and MC4 are arranged along bit line 1b. The MOS transistor of memory cell MC3 is connected to bit line 1a at a bit line contact 7. Capacitors 8a and 8b are formed at an upper layer of memory cell MC3 to storage contacts. In such memory cell layout, memory cells MC1 and MC3 are arranged spaced by a prescribed distance along bit line 1a, and memory cells MC2 and MC4 are arranged along bit line 1b shifted from memory cells MC1 and MC3 by one half the distance between centers of memory cells MC1 and MC3. However, in such an arrangement, element isolating region between adjacent two memory cells is considerably large, resulting in wasteful area 9, which leads to lower degree of integration.

There is another disadvantage in forming the bit line pair. Namely, it is difficult to provide folded bit lines while size of the memory cells are minimized and memory cells are laid out without wasteful region left between adjacent memory cells. In order to solve the above described problems, a semiconductor device having the following layout has been proposed.

FIG. 3 is a plan view of a semiconductor memory device disclosed in Japanese Patent Laying-Open No. 5-41500. In the example shown in FIG. 3, a pair of adjacent bit lines 1a and 1b are arranged separately in two electrically insulated layers, enabling formation of folded bit line structure which could not be implemented by the conventional single layered bit line structure. Accordingly, element isolating region between adjacent memory cells can be minimized, and highly integrated memory cells can be obtained without such a wasteful region 9 as shown in FIG. 2.

However, if such a layout as shown in FIG. 3 is employed, in forming bit lines, the number of manufacturing steps would be doubled as compared with formation of bit lines in only one layer, as the bit lines are formed into electrically insulated separate layers. In other words, the manufacturing process would be complicated. Further, since bit lines are formed in two separate layers electrically insulated from each other, formation of contact holes become more difficult as compared with the bit lines formed in one layer.

Further, at portions where bit lines are overlapped partially with each other with an interlayer insulating film interposed, bit line capacitance is increased, causing delay in circuit operation.

SUMMARY OF THE INVENTION

Therefore, an object of the present invention is to provide a memory cell layout structure for a semiconductor memory device by which bit lines can be formed in a single layer while minimizing the design dimension of the memory cells, without leaving wasteful areas in the memory cell region.

Briefly stated, in the present invention, a plurality of memory cells are arranged at an equal distance along one direction on a main surface of a semiconductor substrate, thus forming a first memory cell group, while a plurality of memory cells are arranged adjacent to the first memory cell group and spaced by the same distance as in the first memory cell group, thus forming a second memory cell group, with the central position of each memory cell of the second memory cell group being shifted by ⅙ of lateral distance of each memory cell (⅙ pitch) with respect to the central position of each memory cell of the first memory cell group.

Therefore, according to the present invention, bit lines can be formed in a single layer without leaving any wasteful area in the memory cell region while minimizing design dimension of the memory cells. Accordingly, the bit lines which have been formed in two layers in the prior art can be formed through half the number of manufacturing steps, the manufacturing process can be simplified, and manufacturing cost can be reduced.

In a preferred embodiment, a plurality of memory array units each including the first memory cell group and the second memory cell group are combined, forming a prescribed rectangular shape. Therefore, wasteful area in the memory cell region can be reduced and the chip size can be reduced.

Further, in a preferred embodiment, a memory cell includes one switching transistor, one capacitor and a storage node contact for connecting a first electrode of the switching transistor to the capacitor, a bit line to be connected to the second electrode of the switching transistor is formed on a main surface of a semiconductor substrate, and the bit line is provided through the storage node contact. Therefore, all the bit lines can be formed in a single layer.

Further, in a more preferred embodiments, as the bit lines are provided in the folded bit line structure, influence of noise and the like on the bit lines can be offset as the noises are set to the in-phase mode.

In a more preferred embodiment, a word line is provided which is connected to an input electrode of the switching transistor on the semiconductor substrate, and the word line is provided to cross the bit line and to detour the storage node contact. The word line is bent every time it crosses a bit line, or bent every time it crosses a plurality of bit lines.

In a more preferred embodiments, a capacitor is formed in a layer upper than the layers for the switching transistor and the bit line, and the capacitor includes a highly dielectric or ferroelectric insulating film. Therefore, in this embodiment, the area occupied by the electrodes of the capacitor can be maximized, ensuring sufficient capacitance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
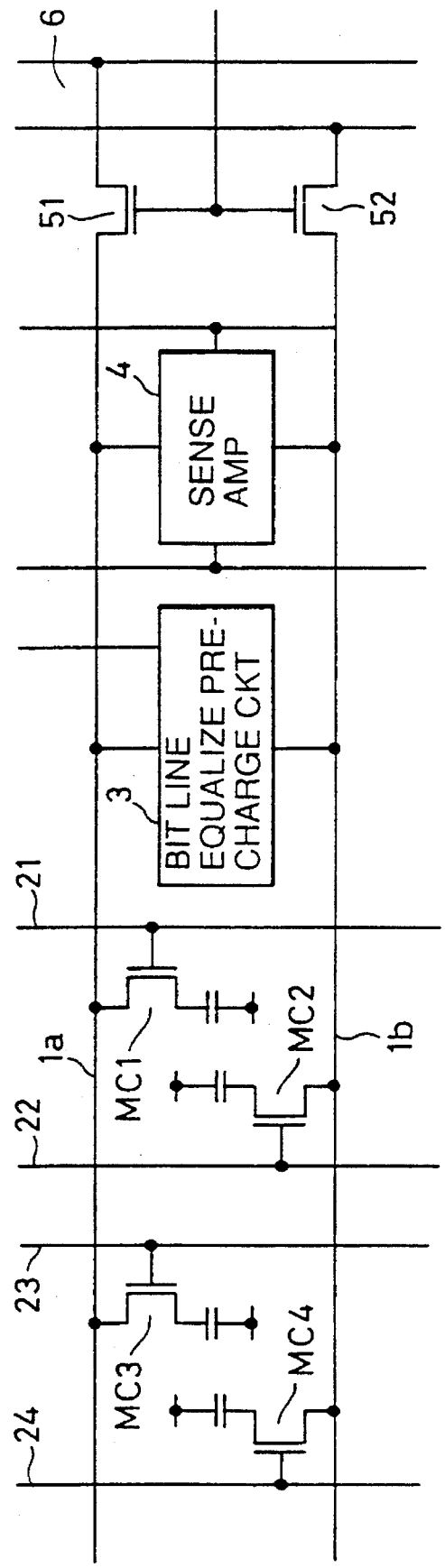
FIG. 1 is a schematic diagram showing conventional memory cells connected to folded bit lines and peripheral circuitry.
Figure 2:
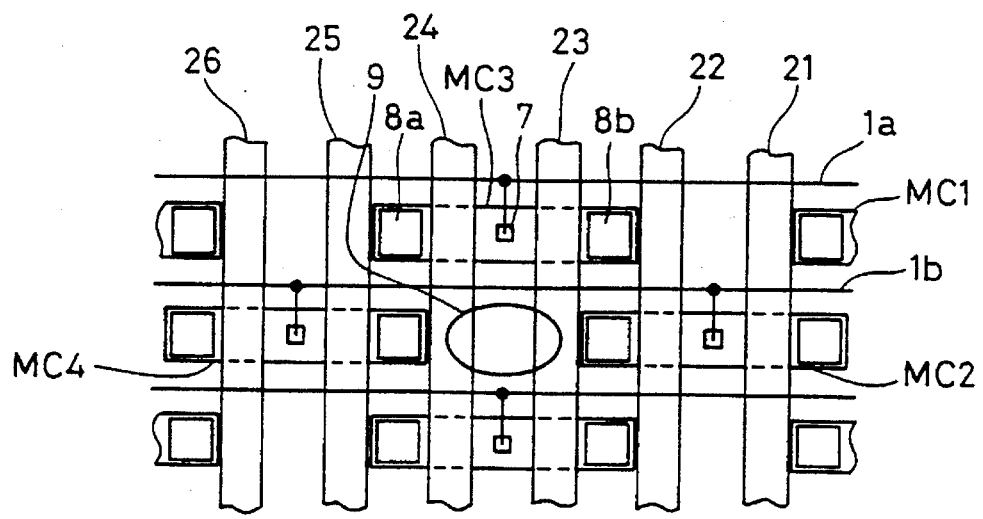
FIG. 2 shows a layout of memory cells of the conventional DRAM shown in FIG. 1.
Figure 3:
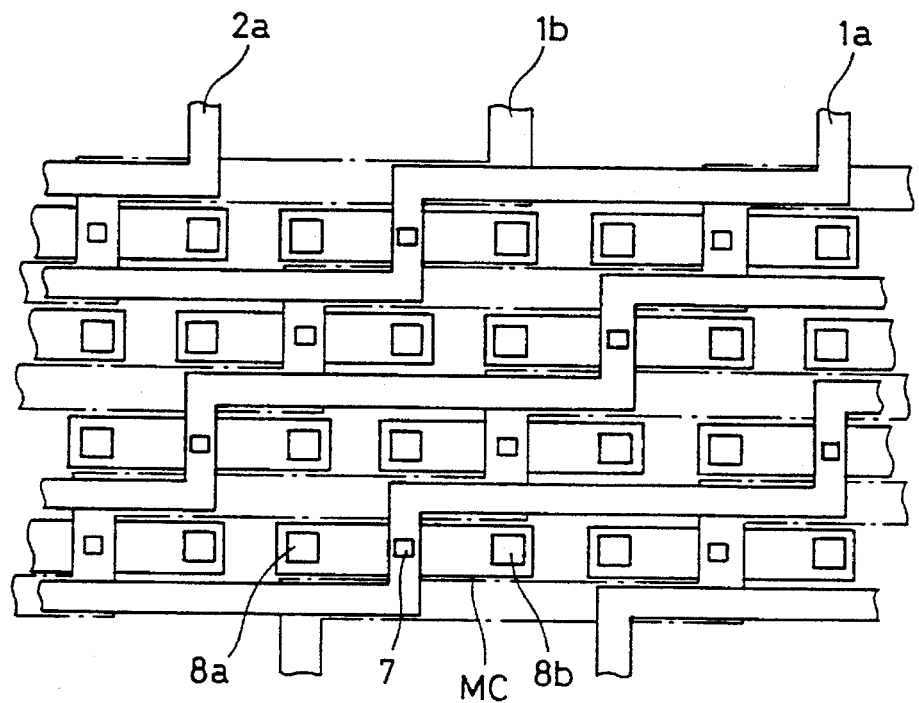
FIG. 3 is a plan view showing another example of the conventional memory cell layout.
Figure 4:
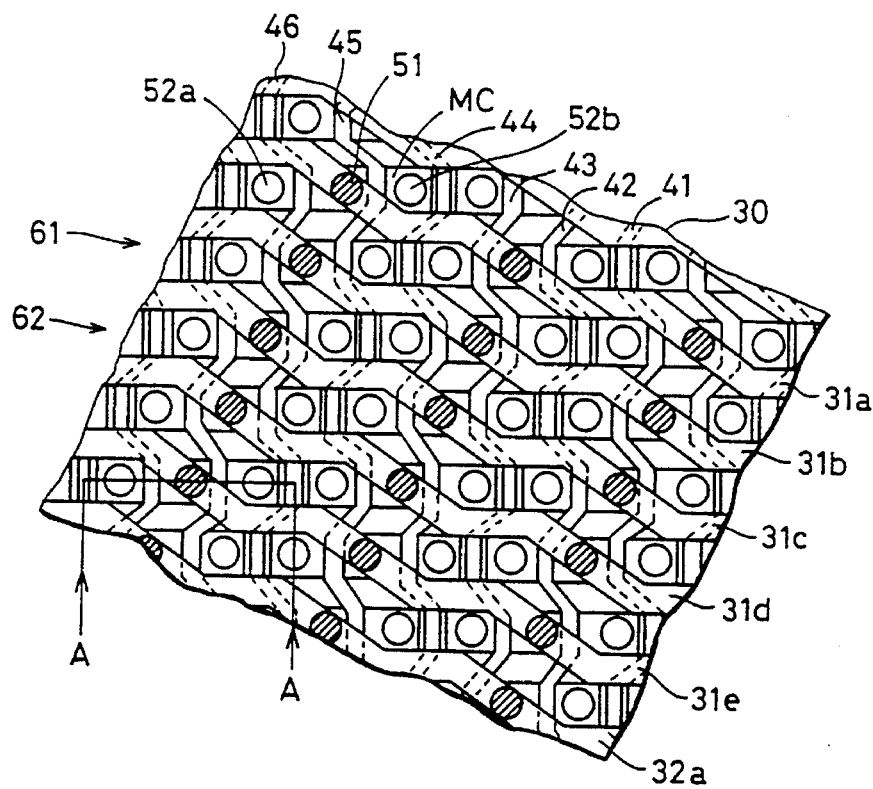
FIG. 4 is a plan view of one embodiment of the present invention.

Referring to FIG. 4, a plurality of memory cells MC are arranged spaced by an equal distance along one direction on a main surface of semiconductor substrate 30, thus forming a first memory cell group 61. A second memory cell group 62 is arranged adjacent to the first memory cell group 61. The second memory cell group 62 includes a plurality of memory cells MC arranged spaced by the same distance as in the first memory cell group 61, and central position of each of the memory cells included in the second memory cell group 62 is shifted by ⅙ pitch from the central position of the memory cell in the first memory cell group 61.

Figure 5:
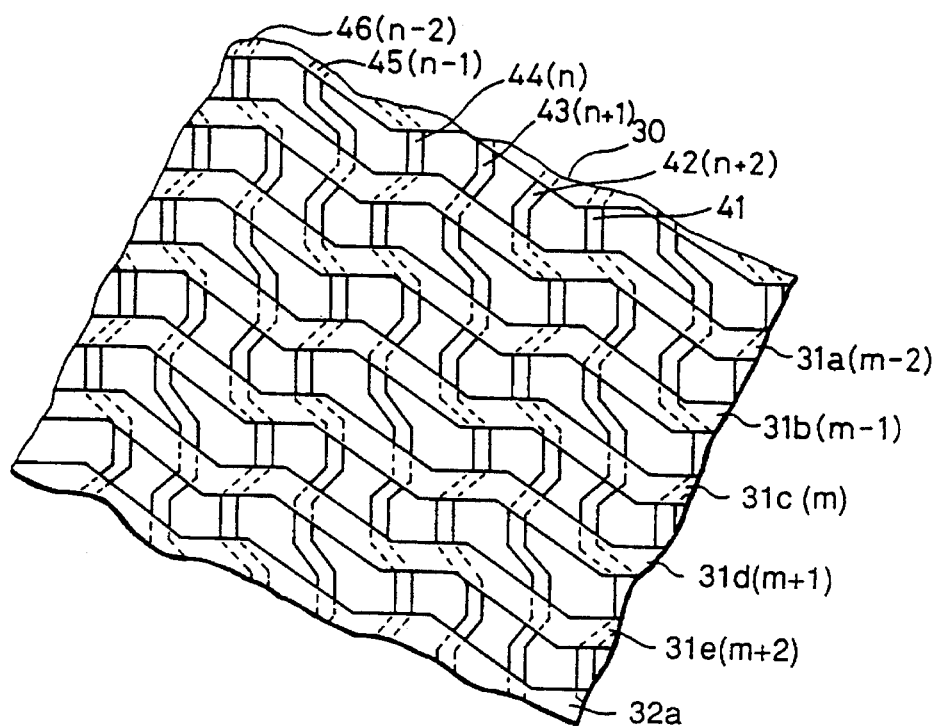
FIG. 5 is a plan view showing only the bit lines and word lines of FIG. 4.
Figure 6:
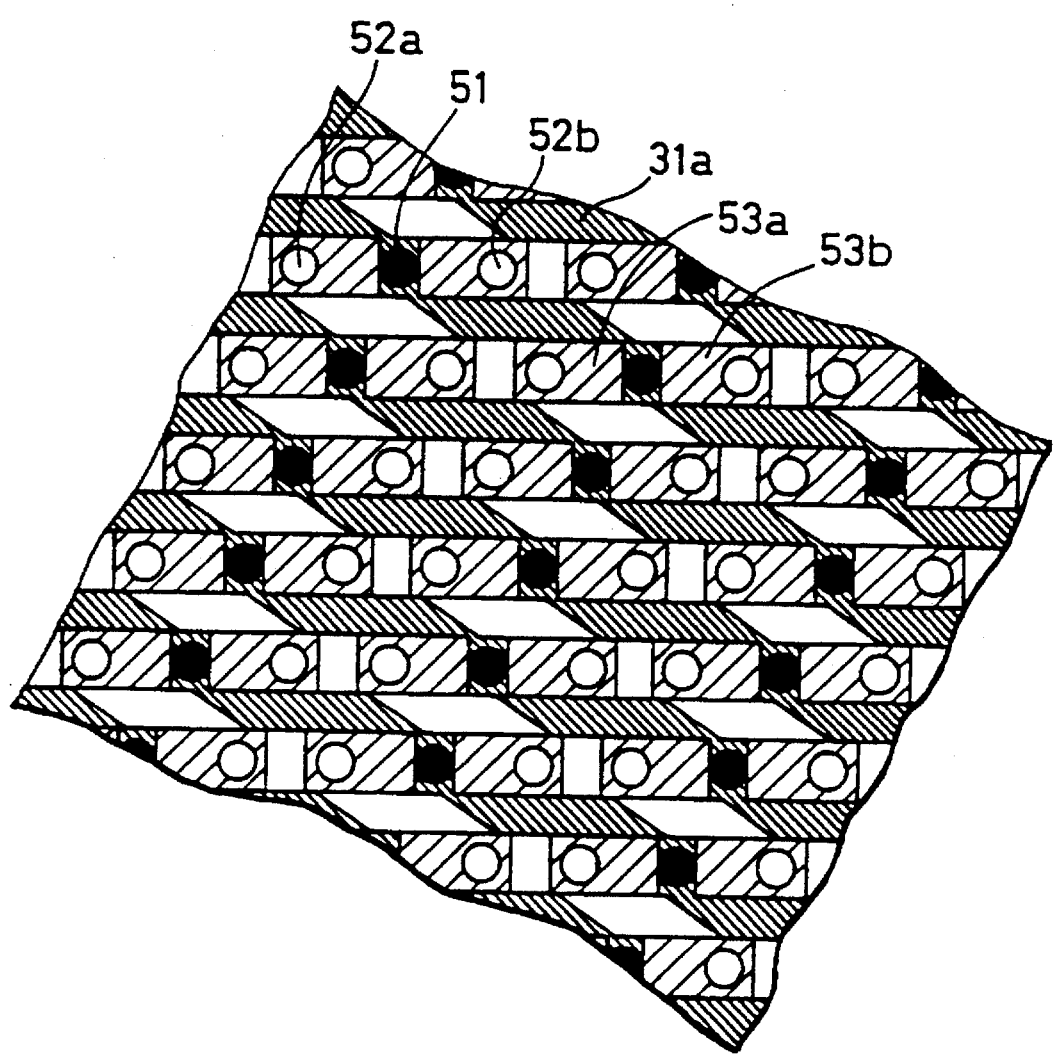
FIG. 6 is a plan view showing only the capacitors, storage contact and bit line contacts of the memory cells shown in FIG. 4.

Bit line pairs 31a to 32a are formed in a single layer such that there is sufficient space greater than minimum design dimension between adjacent bit lines, as shown in FIG. 5. Word lines 41 to 46 are formed such that each word line is bent every time it crosses one bit line. Further, a set of electrodes, that is, a storage node and a cell plate, constituting each of capacitors 53a, 53b are formed in a layer upper than the bit lines and directly above storage node contacts 52a and 52b, as shown in FIG. 6.

The effects obtained by shifting the central position of each memory cell MC of the second memory cell group 62 by ⅙ with respect to each memory cell MC of the first memory cell group 61 shown in FIG. 4 will be described.

FIGS. 7 to 12 show examples of arrangement in which the central position of each memory cell of the second memory cell group 62 is shifted from each memory cell MC of the first memory cell group 61 by ⅓ pitch, ¼ pitch, ⅕ pitch, ⅙ pitch, ⅐ pitch and ⅛ pitch, respectively. The right portion of each of the figures represent arrangement of the memory cells and word lines, while the left portions of each of the figure represent a parallelogram formed by the memory cell regions.

Figure 7:
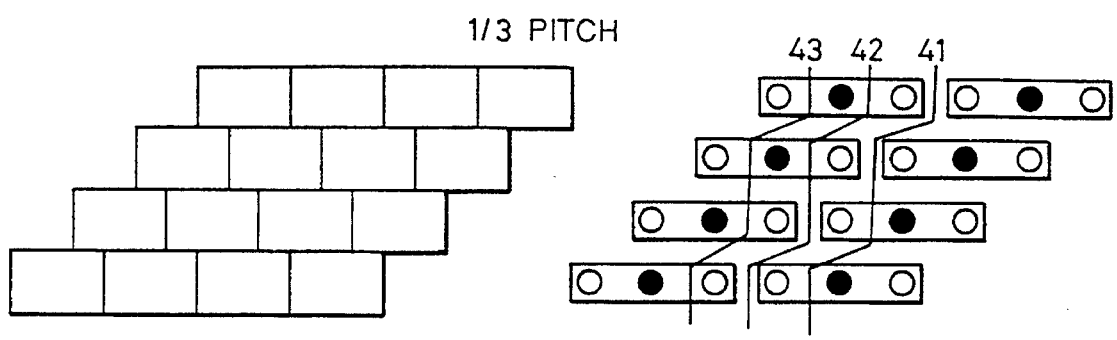
FIG. 7 shows an example in which central position of each memory cell of a first memory cell group is shifted by ⅓ pitch from the central position of each memory cell of the second memory cell group.
Figure 8:
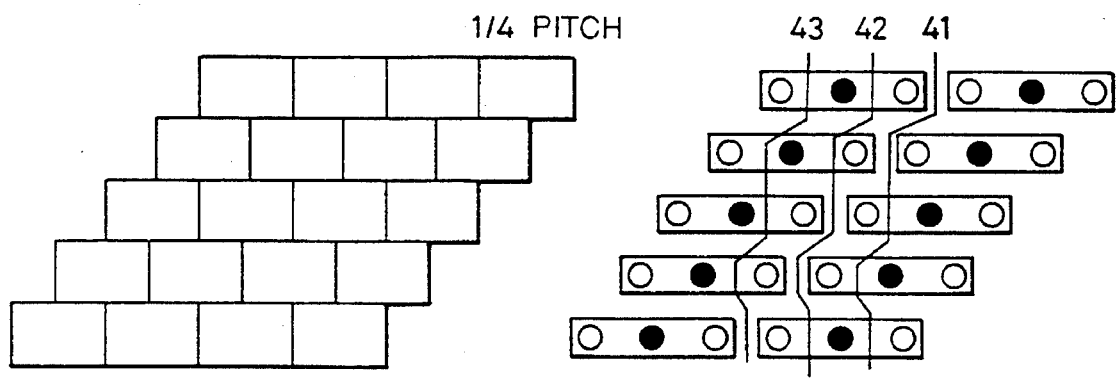
FIG. 8 shows an example in which the memory cells of the first memory cell group is shifted by ¼ pitch from the second memory cell group.
Figure 9:
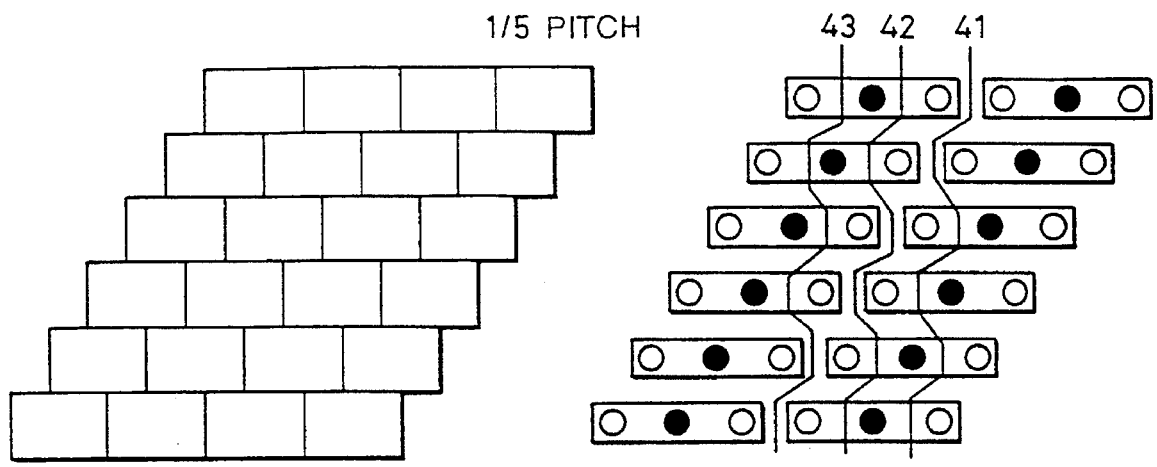
FIG. 9 shows an example in which the first memory cell group is shifted by ⅕ pitch from the second memory cell group.
Figure 10:
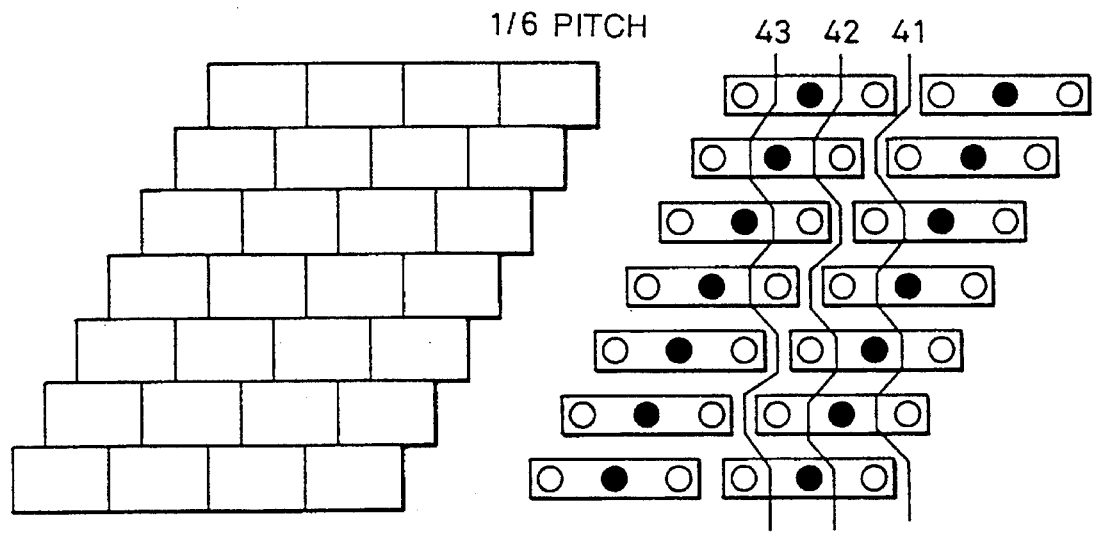
FIG. 10 shows an example in which the first memory cell group is shifted by ⅙ pitch from the second memory cell group.

Referring to FIG. 10, when the memory cells MC are arranged shifted by ⅙ pitch, word lines 41, 42 . . . are formed approximately vertical from the upper side to the lower side, though little meandering. When the memory cells MC are arranged shifted by ⅓ pitch as shown in FIG. 7, word lines 41, 42, . . . are arranged inclined to the left as they extend from the upper to the lower side. When the memory cells MC are arranged shifted by ¼ pitch as shown in FIG. 8, and ⅕ pitch as shown in FIG. 9, inclination to the left side of the word lines 41, 42 . . . as they extend from the upper to the lower side becomes smaller.

Figure 11:
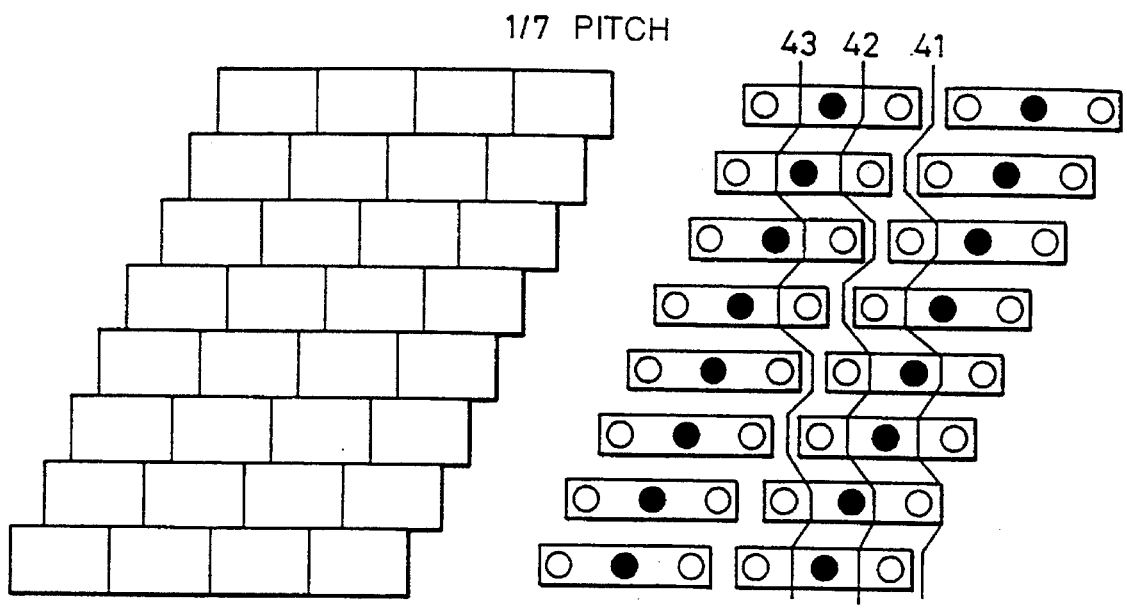
FIG. 11 shows an example in which the first memory cell group is shifted by ⅐ pitch from the second memory cell group.
Figure 12:
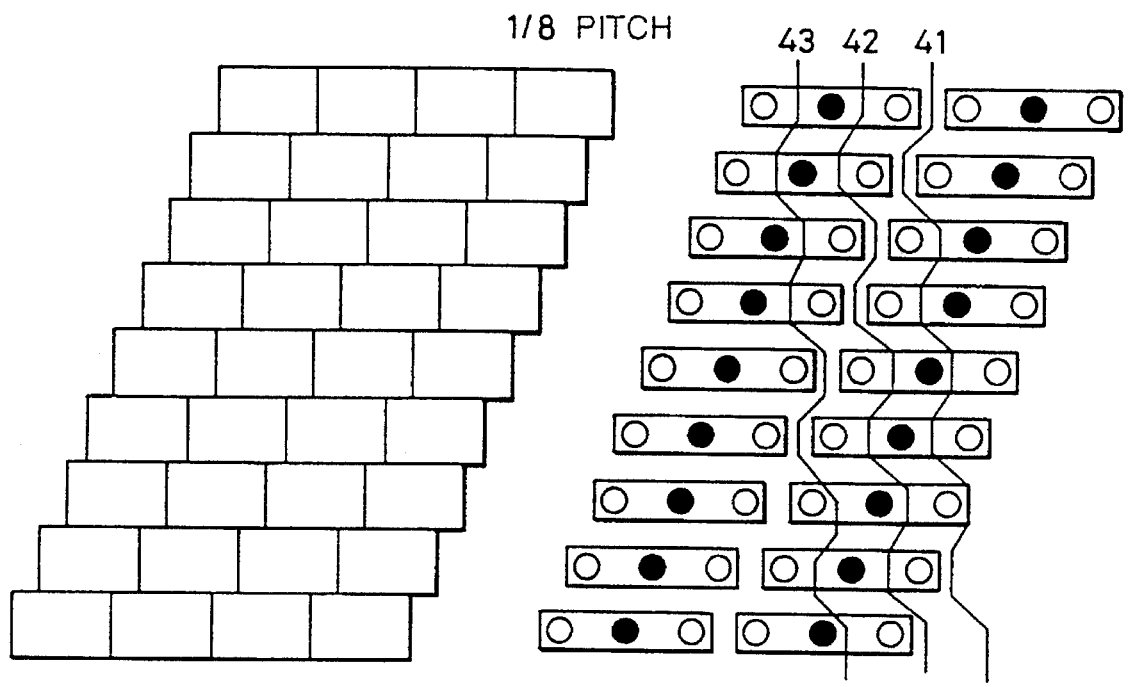
FIG. 12 shows an example in which the first memory cell group is shifted by ⅛ pitch from the second memory cell group.

By contrast, referring to FIG. 12, when memory cells MC are arranged shifted by ⅛ pitch, word lines 41, 42 are inclined to the right side as they extend from the upper to the lower side. When memory cells MC are arranged shifted by ⅐ pitch as shown in FIG. 11, inclination of the word lines 41, 42 to the right side as they extend from the upper to the lower side is made smaller. If word lines 41, 42 . . . are inclined to the left or to the right as they extend from the upper to the lower side, patterns for forming the word lines 41, 42 . . . becomes longer corresponding to the inclination, and the ratio of occupation by the patterns on the substrate becomes higher, hindering higher degree of integration. In this respect, according to one embodiment of the present invention, as the memory cells MC are arranged shifted by ⅙ pitch as shown in FIG. 10, word lines 41, 42 . . . can be made shorter, enabling higher degree of integration.

Figure 13:
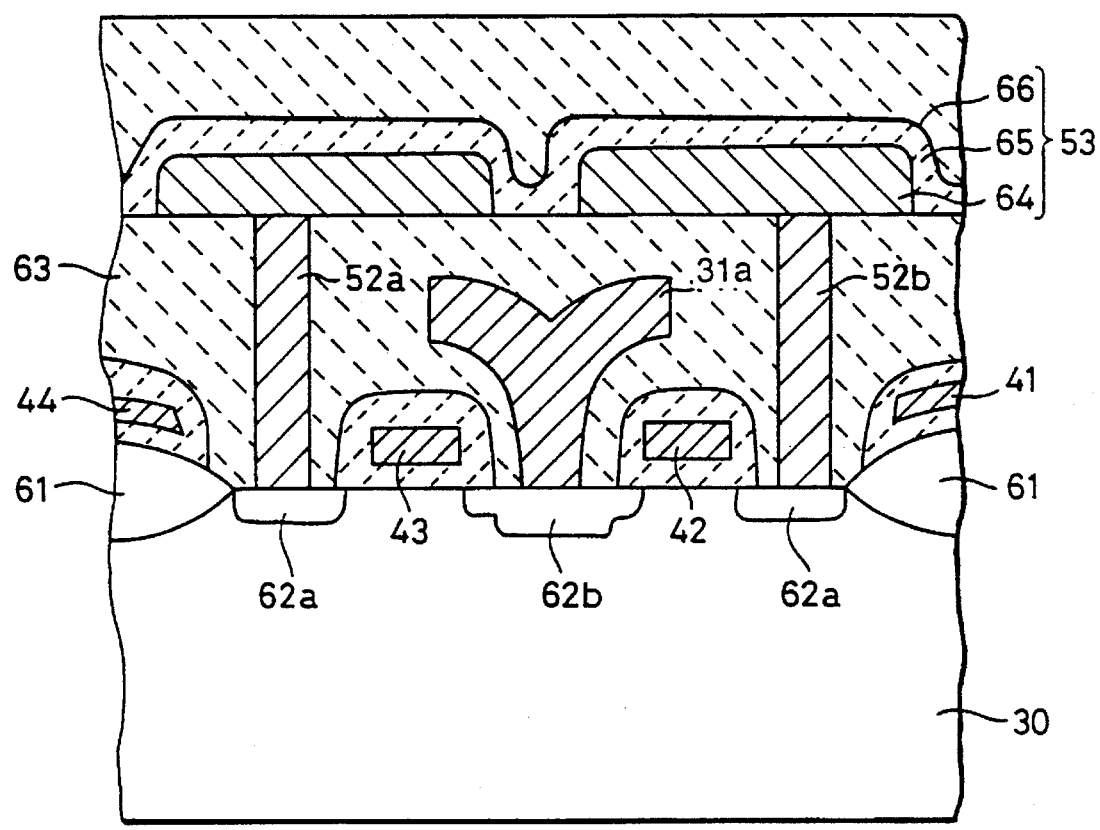
FIG. 13 is a cross section taken along the line A—A of FIG. 4.

FIG. 13 is a cross section taken along the line A—A of FIG. 4. Referring to FIG. 13, element isolating regions 61, 61 are formed on a substrate 30, source/drain regions 62a and 62b are formed between element isolating regions 61, 61, word lines 42 and 43 are formed between source/drain regions 62a and 62b, and a bit line 31a is formed on the region 62b. These are covered by an interlayer insulating film 63, and a capacitor 53 is formed on interlayer insulating film 63. Capacitor 53 is provided by forming an insulating film 65 on storage node 64, and forming a cell plate 66 further thereon. As storage node 64, which is an electrode of capacitor 53, is provided in a layer upper than bit line 31a, it becomes possible to expand the electrode of capacitor 53 directly above bit line 31a. When a highly dielectric or ferroelectric material is used for the insulating film 65, sufficient capacity can be ensured. Storage node 64 and source/drain region 62a are connected by storage node contacts 52a and 52b.

Figures 14, 15:
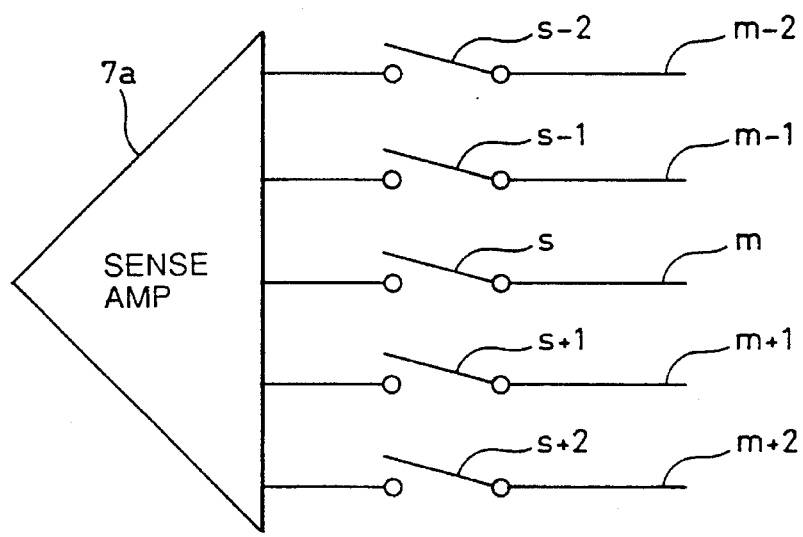
FIG. 14 is an illustration for help understanding operation of one embodiment of the present invention.
FIG. 15 show connection between folded bit lines and a sense amplifier.

FIG. 14 is a table for help understanding the operation of one embodiment of the present invention, and FIG. 15 is a schematic diagram showing connection between folded bit lines and a sense amplifier. A method of sensing in one embodiment of the present invention will be described. For simplicity, bit line pairs 31a to 32a shown in FIG. 4 are denoted by the reference characters m−2 to m+2. Similarly, word lines 41 to 46 are denoted by the reference characters n−2 to n+2. In one embodiment of the present invention, five bit lines m−2 to m+2 constitute folded bit lines, and respective bit lines are interconnected with one sense amplifier 70 through switching transistors s−2 to s+2, respectively. It is assumed that of the five bit lines m−2 to m+2, one is connected to a dummy cell, and data to be read are stored in memory cells connected to other four bit lines. A switching transistor corresponding to the bit line connected to that memory cell which stores the data to be read and the switching transistor corresponding to the bit line connected to the dummy cell are turned on, and remaining three switching transistors are off in data reading. Potential difference between two bit lines is differentially amplified by sense amplifier 70, and the data is read.

FIG. 14 shows which of the memory cells are memory cells storing data and which are the dummy cells serving as reference, with respect to the positions of crossing between bit lines and word lines. In FIG. 14, reference characters m−2 to m+2 represent the aforementioned bit lines, and n−2 to n+2 represent the aforementioned word lines. The reference character D represents a memory cell storing data, while the character R represents a dummy cell serving as a reference.

For example, when bit line m and word line n−2 are raised, switching transistors s and s+2 corresponding to the bit line m to which a memory cell storing data positioned at a crossing with the word line n−2 and corresponding to the bit line m+2 to which a dummy cell serving as a reference is connected at a position crossing word line n−2 are turned on, bit lines m and m+2 are similarly raised, and potential difference between two bit lines are differentially amplified, thus data is read out. As can be seen from FIG. 14, data are stored in memory cells at crossings between bit lines m−2 to m+2 connected to sense amplifier 70 and word line n−2, and when the data is read, the memory cell positioned at a crossing between bit line m+2 and word line n−2 serves as a reference. Similarly, when word line m−1 is raised, a memory cell at a crossing between bit line m is the dummy cell which serves as the reference.

Figure 16:
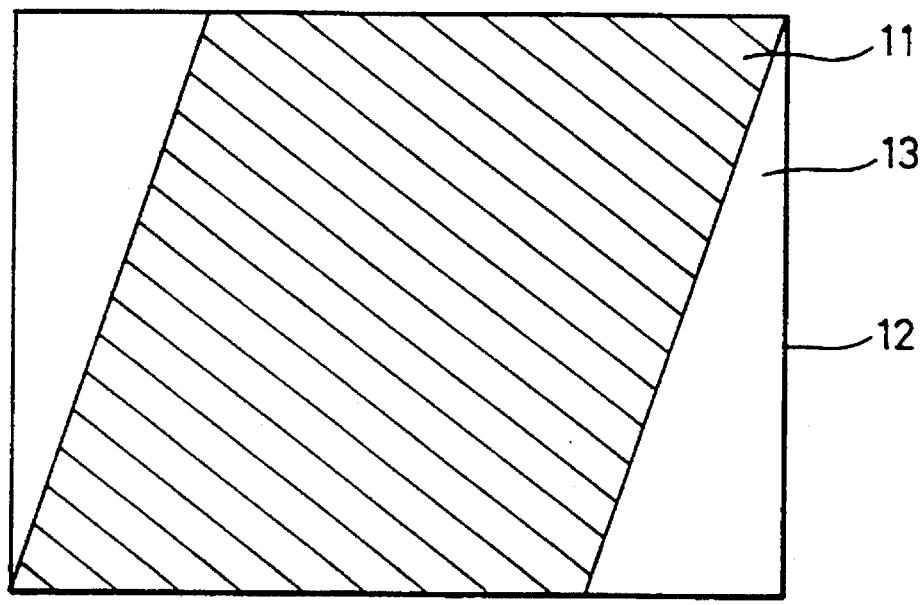
FIG. 16 shows an area occupied by the memory cells in one embodiment of the present invention.

FIG. 16 shows the area occupied by the memory cells in this embodiment, that is, the shape of the memory cell array. When memory cell arrangement such as shown in FIG. 4 is employed, memory cell array 11 as a whole would have an inclined shape as shown in FIG. 16, and therefore there would be large wasteful areas 13 in memory cell forming region 12.

Figure 17:
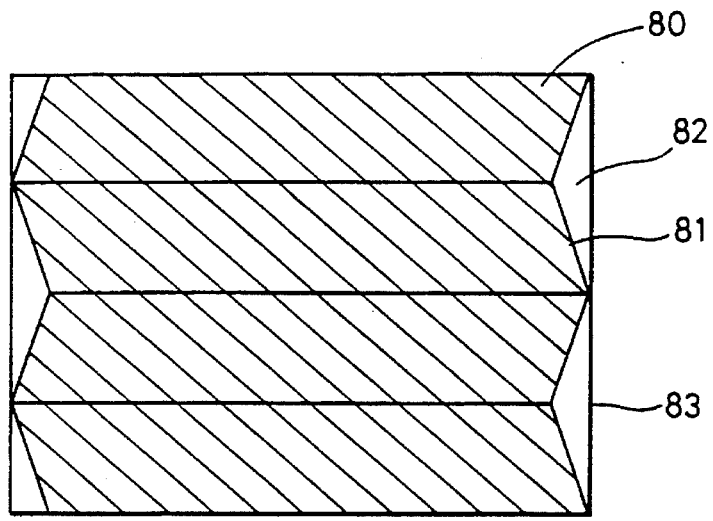
FIG. 17 shows a memory cell region of which shape is obtained by combining a plurality of parallelograms.

Therefore, as shown in FIG. 17, memory cell array units each including a plurality of memory cells and having a shape of parallelogram are combined to form a memory cell array 81. By this combination, wasteful area 82 can be reduced, memory cell area can be further enlarged, and thus semiconductor memory device 83 having larger capacity can be obtained.

Figure 18:
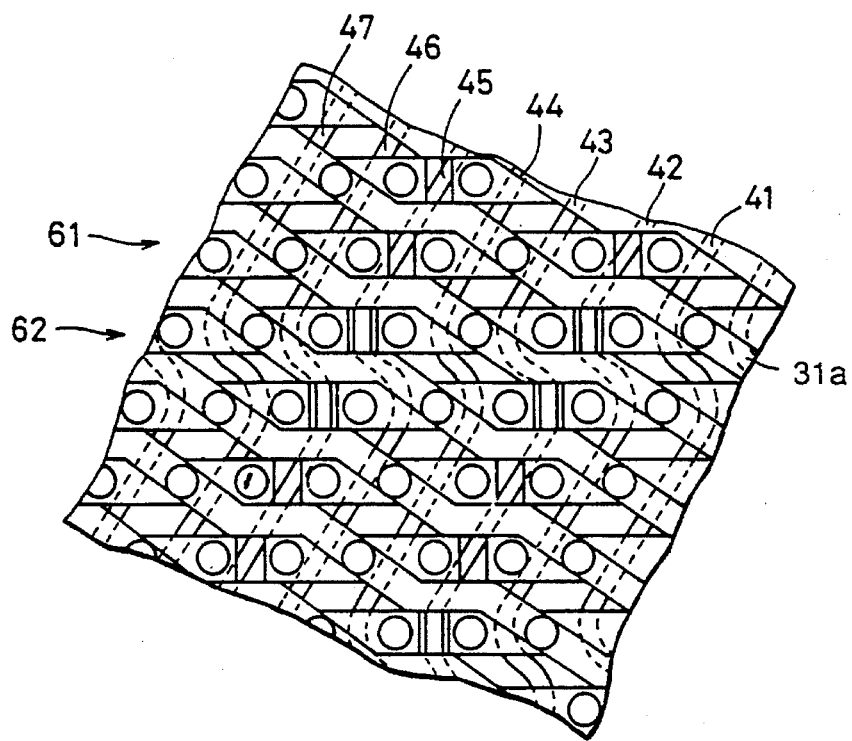
FIG. 18 shows an arrangement of memory cells in accordance with another embodiment of the present invention.

FIG. 18 is a plan view showing a layout of memory cells in accordance with another embodiment of the present invention. In the embodiment shown in FIGS. 4, word lines 41 to 46 are bent every time the word line crosses one bit line. In this embodiment, word lines 41 to 47 are formed such that they bent every time the word line cross a plurality of bit lines. Therefore, word lines 41 to 47 are laid out with the direction of word line more orthogonal with respect to the direction of bit lines as compared with FIG. 4, and the frequency of bending is reduced. In this embodiment, word lines 41 to 47 are formed which are less frequently bent as compared with the embodiment of FIG. 4, and as for the shape of the memory cell array, a plurality of parallelograms are combined as shown in FIG. 17 in the similar manner as in the embodiment of FIG. 4. Therefore, wasteful area of the memory region can be reduced, and the memory cells can be integrated to a higher degree.

As described above, according to the present embodiment, a first memory cell group 61 including a plurality of memory cells formed on a semiconductor substrate 30 are arranged spaced by an equal distance along one direction, and a second memory cell group 62 including a plurality of memory cells adjacent to the memory cells MC of the first memory cell group 61 is arranged, with the central position of each of the memory cells in the second memory cell group 62 being shifted by ⅙ of the distance between central position of adjacent memory cells, with respect to the first memory cell group 61 along one direction. Therefore, wasteful area is not left in the memory cell region, and bit lines can be formed in a single layer even when the memory cells are designed with minimum dimension. Therefore, the bit lines which have been formed in two separate layers in the prior art can be formed through half the number of process steps, the manufacturing process can be simplified, and the manufacturing cost can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory cell layout structure for a semiconductor memory device, comprising:

a semiconductor substrate;

a first memory cell group including a plurality of first memory cells, said first cells arranged spaced by an equal distance between a central position of each first cell along one direction on a main surface of said semiconductor substrate; and a second memory cell group adjacent to said first memory cell group, including a plurality of second memory cells, said second cells arranged spaced apart by the same distance between a central position of each said second cell as in said first memory cell group, with the central position of each second memory cell being shifted by ⅙ pitch in said one direction with respect to the central position of each first, memory cell.

2. The memory cell layout structure for a semiconductor memory device according to claim 1, wherein a plurality of memory array units each including said first memory cell group and said second memory cell group are combined to form a prescribed rectangular shape.

3. The memory cell layout structure for a semiconductor memory device according to claim 1, wherein each of said first and second memory cells includes:

one switching transistor, one capacitor, and a storage node contact for connecting a first electrode of said switching transistor to said capacitor; and wherein a bit line pair is formed on the main surface of said semiconductor substrate which is connected to a second electrode of said switching transistor and detours said storage node contact.

4. The memory cell layout structure for a semiconductor memory device according to claim 3, wherein each bit line of said bit line pair has a folded bit line structure.

5. The memory cell layout structure for a semiconductor memory device according to claim 3, wherein a word line is formed on said semiconductor substrate to be connected to an input electrode of said switching transistor, crossing a bit line of said bit line pair and detouring said storage node contact.

6. The memory cell layout structure for a semiconductor memory device according to claim 5, wherein said word line is formed bent every time it crosses said bit line.

7. The memory cell layout structure for a semiconductor memory device according to claim 5, wherein said word line is formed bent every time it crosses several bit lines.

8. The memory cell layout structure for a semiconductor memory device according to claim 3, wherein said capacitor is formed in a layer upper than said bit line pair and said switching transistor.

9. The memory cell layout structure for a semiconductor memory device according to claim 3, wherein said capacitor includes an insulating film which is highly dielectric or ferroelectric.

* * * * *